US010297039B2

(12) United States Patent
Tanaka et al.

(10) Patent No.: US 10,297,039 B2
(45) Date of Patent: May 21, 2019

(54) RECOGNITION DEVICE

(71) Applicant: FUJI CORPORATION, Chiryu-shi (JP)

(72) Inventors: Kenji Tanaka, Toyota (JP); Fumiya Kato, Kariya (JP); Takuya Nagaishi, Okazaki (JP); Shigeo Saito, Toyota (JP); Yasunari Mizuno, Toyohashi (JP)

(73) Assignee: FUJI CORPORATION, Chiryu-shi (JP)

(*) Notice: Subject to any disclaimer, the term of this patent is extended or adjusted under 35 U.S.C. 154(b) by 0 days.

(21) Appl. No.: 15/557,826

(22) PCT Filed: Mar. 18, 2015

(86) PCT No.: PCT/JP2015/057994
§ 371 (c)(1),
(2) Date: Sep. 13, 2017

(87) PCT Pub. No.: WO2016/147332
PCT Pub. Date: Sep. 22, 2016

(65) Prior Publication Data
US 2018/0047180 A1   Feb. 15, 2018

(51) Int. Cl.
*G06T 7/00* (2017.01)
*G06T 7/70* (2017.01)
*H05K 13/08* (2006.01)

(52) U.S. Cl.
CPC .............. *G06T 7/70* (2017.01); *G06T 7/0004* (2013.01); *H05K 13/08* (2013.01);
(Continued)

(58) Field of Classification Search
CPC ... G06K 9/03; G06K 9/209; G06T 2219/2021
(Continued)

(56) References Cited

U.S. PATENT DOCUMENTS 6,336,004 B1 *  1/2002  Ishii ..................... G01C 3/085
                                             396/100
6,542,696 B2 *  4/2003  Kindaichi ............... G02B 7/32
                                             396/123
(Continued)

FOREIGN PATENT DOCUMENTS

JP       06-083945 A      3/1994
JP    2002-280799 A      9/2002
(Continued)

OTHER PUBLICATIONS

International Search report dated Jun. 23, 2015 in PCT/JP2015/057994, filed on Mar. 18, 2015.
(Continued)

*Primary Examiner* — Yosef Kassa
(74) *Attorney, Agent, or Firm* — Oblon, McClelland, Maier & Neustadt, L.L.P.

(57) ABSTRACT

With a recognition device of the present invention, when a target component that is an imaging target is moved in a direction from one to another of an upper limit imaging position and a lower limit imaging position, a protruding section of the target component is imaged at each of a predetermined pitch (0.1 mm). Then, it is determined whether it is possible to recognize the position of the protruding section of the target component based on image data of each pitch (O: recognition possible, X: recognition not possible). Here, from among imaging positions (H4 to H10) according to image data for which it was determined to be possible to recognize the position of the protruding section of the target component, a position (H7) that is at a central point between a position closest to the upper limit imaging position (H4) and a position closest to the lower limit imaging position (H10) is decided as a recommended imaging position. By this, it is possible to image the protruding section close to a central point inside the emitting range of the light emitted from the light source, meaning that the protruding section is appropriately imaged and the position of the protruding section can be appropriately recognized.

4 Claims, 9 Drawing Sheets

(52) U.S. Cl.
CPC ..... *H05K 13/0812* (2018.08); *H05K 13/0813* (2018.08); *G06T 2207/30141* (2013.01)

(58) Field of Classification Search
USPC ....... 382/141, 142, 145, 147, 151, 152, 170, 382/282; 348/86, 125, 126
See application file for complete search history.

(56) References Cited

U.S. PATENT DOCUMENTS

| | | | | |
|---|---|---|---|---|
| 6,853,837 | B1* | 2/2005 | Oda | H04W 52/52 375/345 |
| 7,076,094 | B2 | 7/2006 | Chi et al. | |
| 7,111,109 | B2* | 9/2006 | Tsunemiya | G06F 1/3203 711/103 |
| 8,237,935 | B2* | 8/2012 | Nygaard | G01B 11/2425 250/559.24 |
| 9,110,032 | B2* | 8/2015 | Farley, III | G01M 17/027 |

FOREIGN PATENT DOCUMENTS

| | | |
|---|---|---|
| JP | 2011-082506 A | 4/2011 |
| JP | 2011-228583 A | 11/2011 |

OTHER PUBLICATIONS

Extended Search Report dated May 7, 2018 in European Patent Application No. 15885428.1.
Office Action dated Nov. 28, 2018 issued in corresponding Japanese Patent Application No. 2017-505937 with English Translation.

\* cited by examiner

RECOGNITION DEVICE

TECHNICAL FIELD

The present invention relates to a recognition device for recognizing a position of a protruding section of a component to be mounted on a board.

BACKGROUND ART

To mount a component on a board, it is necessary to appropriately recognize positions of protrusions, such as electrodes, of the component. To do this, with a component mounter that mounts components on a board, imaging of the component is performed, and recognition processing of positions of protruding sections of the component is performed based on the image data. In detail, light is emitted from a light source onto the protruding section of the component, and the protrusion of the component is imaged based on light reflected by the protruding section. Then, recognition processing of the position of the protruding section of the component is performed based on the image data. Various ways of imaging a component are disclosed in the patent literature below.

Patent Literature 1: JP-A-2011-82506

SUMMARY OF INVENTION

Technical Problem

According to technology disclosed in the above patent literature, it is possible to recognize a position of a protruding section of a component to a certain extent. However, for example, in a case in which the emitting range of the light emitted from the light source is relatively narrow, light from the light source will fail to reach the protruding section of the component, such that imaging of the protruding section of the component cannot be performed, and the position of the protruding section cannot be recognized. The present invention takes account of the above circumstances, and an object thereof is to appropriately recognize a position of a protruding section of a component even in a case in which the emitting range of the light emitted from the light source is relatively narrow.

Solution to Problem

To solve the above problems, a recognition device according to the present invention is a recognition device for recognizing a position of a protruding section of a component to be mounted on a board, the recognition device including: a light source configured to emit light to a protruding section of a component; an imaging device configured to image the protruding section of the component based on light reflected by the protruding section when light is emitted from the light source to the protruding section of the component; and a data analysis device configured to recognize the position of the protruding section of the component imaged by the imaging device based on image data imaged by the imaging device, the data analysis device including a creating section configured to, when a target component that is an imaging target of the imaging device is moved from one to another of a predetermined first set position and a second set position that is lower than the first set position, use the imaging device to image the protruding section of the component for each of a predetermined pitch and create image data for each pitch, a determining section configured to determine whether the position of the protruding section of the component can be recognized based on each piece of image data for each pitch created by the creating section, and a deciding section configured to decide, from among imaging positions that are positions of the target component during imaging according to image data for which it was determined by the determining section to be possible to recognize the position of the protruding section of the target component, a position that is between a recognition upper limit position that is a position closest to the first set position and a recognition lower limit position that is a position closest to the second set position as a recommended imaging position.

To solve the above problems, a recognition device according to the present invention is a recognition device for recognizing a position of a protruding section of a component to be mounted on a board, the recognition device including: a light source configured to emit light to a protruding section of a component; an imaging device configured to image the protruding section of the component based on light reflected by the protruding section when light is emitted from the light source to the protruding section of the component; and a data analysis device configured to recognize the position of the protruding section of the component imaged by the imaging device based on image data imaged by the imaging device, the data analysis device including a creating section configured to use the imaging device to, in a state with a target component that is an imaging target of the imaging device positioned at a specified position, image the protruding section of the component, a determining section configured to determine whether the position of the protruding section of the component can be recognized based on image data created by the creating section, and a deciding section configured to, in a case in which it is determined by the determining section that the position of the protruding section of the component can be recognized, decide an imaging position that is the position of the target component during imaging according to the decided image data as a recommended imaging position, wherein the creating section performs imaging multiple times until it is determined by the determining section that the position of the protruding section of the component can be recognized based on the image data created by the creating section, such that, during a first imaging, the protruding section of the target component positioned at a reference position is imaged, during a 2N (where N is a positive integer) imaging, the protruding section of the target component positioned at a position separated by a distance corresponding to (set distance×N) in a direction from the reference position to one of the first set position and the second set position is imaged, and during a (2N+1) (where N is a positive integer) imaging, the protruding section of the target component positioned at a position separated by a distance corresponding to (set distance×N) in a direction from the reference position to another of the first set position and the second set position is imaged, and image data is created by the creating section, and wherein the determining section determines whether the position of the protruding section of the target component can be recognized based on the image data created by the creating section for each creation of image data by the creating section.

Advantageous Effects of Invention

With a recognition device of the present invention, when a target component that is an imaging target is moved in a direction from one to another of a predetermined first set position and second set position that is set lower than the first set position, a protruding section of the target component is imaged at each of a predetermined pitch. Then, it is determined whether it is possible to recognize the position of the protruding section of the target component based on image data of each pitch. Then, from among imaging positions according to image data for which it was determined by the determining section to be possible to recognize the position of the protruding section of the target component, a position that is between a position closest to the first set position and a position closest to the second set position is decided as a recommended imaging position.

Also, with a recognition device of the present invention, a target component that is an imaging target is imaged at a position separated from a reference position centered on a predetermined reference position by a predetermined pitch each time. Then, based on the image data, imaging of the component is performed in a range between the predetermined first set position and the second set position that is lower than the first set position until the position of the protruding section of the component can be recognized, and an imaging position at which the position of the protruding section of the component is appropriately recognized is decided as the recommended imaging position.

In such a manner, by deciding a recommended imaging position and performing imaging of a component at that decided recommended imaging position, it is possible to image a protruding section of a component when the protruding section is close to a central point inside the emitting range of the light emitted from a light source. By this, the protruding section is appropriately imaged, and the position of the protruding section can be recognized appropriately.

DESCRIPTION OF PREFERRED EMBODIMENTS

The following describes in detail referring to the figures an example embodiment of the present invention.

Figure 1:
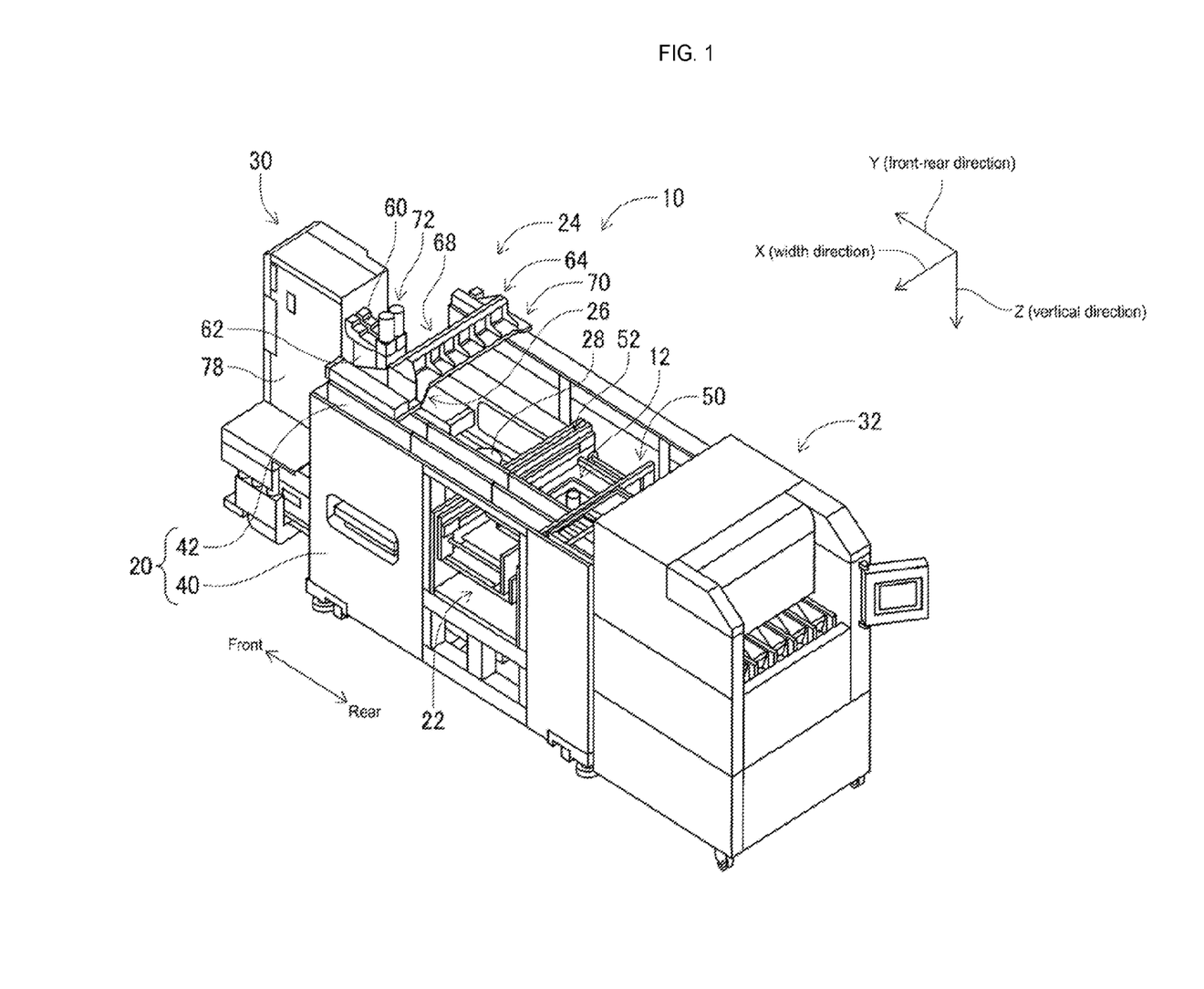
FIG. 1 is a perspective view of a component mounter.

Configuration of component mounter FIG. 1 shows component mounter 10. Component mounter 10 performs work of mounting components on circuit board 12. Component mounter 10 is provided with device main body 20, board conveying and holding device 22, component mounting device 24, mark camera 26, component camera 28, component supply device 30, loose component supply device 32, and control device (refer to FIG. 3) 34. Note that, examples of circuit board 12 include circuit boards and boards with a three-dimensional construction, examples of a circuit board being a printed wiring board or a printed circuit board.

Device main body 20 is configured from frame section 40 and beam section 42 that is mounted on the frame section 40. Board conveying and holding device 22 is positioned centrally inside frame section 40 in the front-rear direction, and includes conveyance device 50 and clamp device 52. Conveyance device 50 conveys circuit board 12, and clamp device 52 holds circuit board 12. Thus, board conveying and holding device 22 conveys circuit board 12 and fixedly holds circuit board 12 at a specified position. Note that, in the descriptions below, the conveyance direction of circuit board 12 is referred to as the X direction, the direction horizontally perpendicular to the X direction is referred to as the Y direction, and the vertical direction is referred to as the Z direction. That is, the width direction of component mounter 10 is the X direction, and the front-rear direction is the Y direction.

Figure 2:
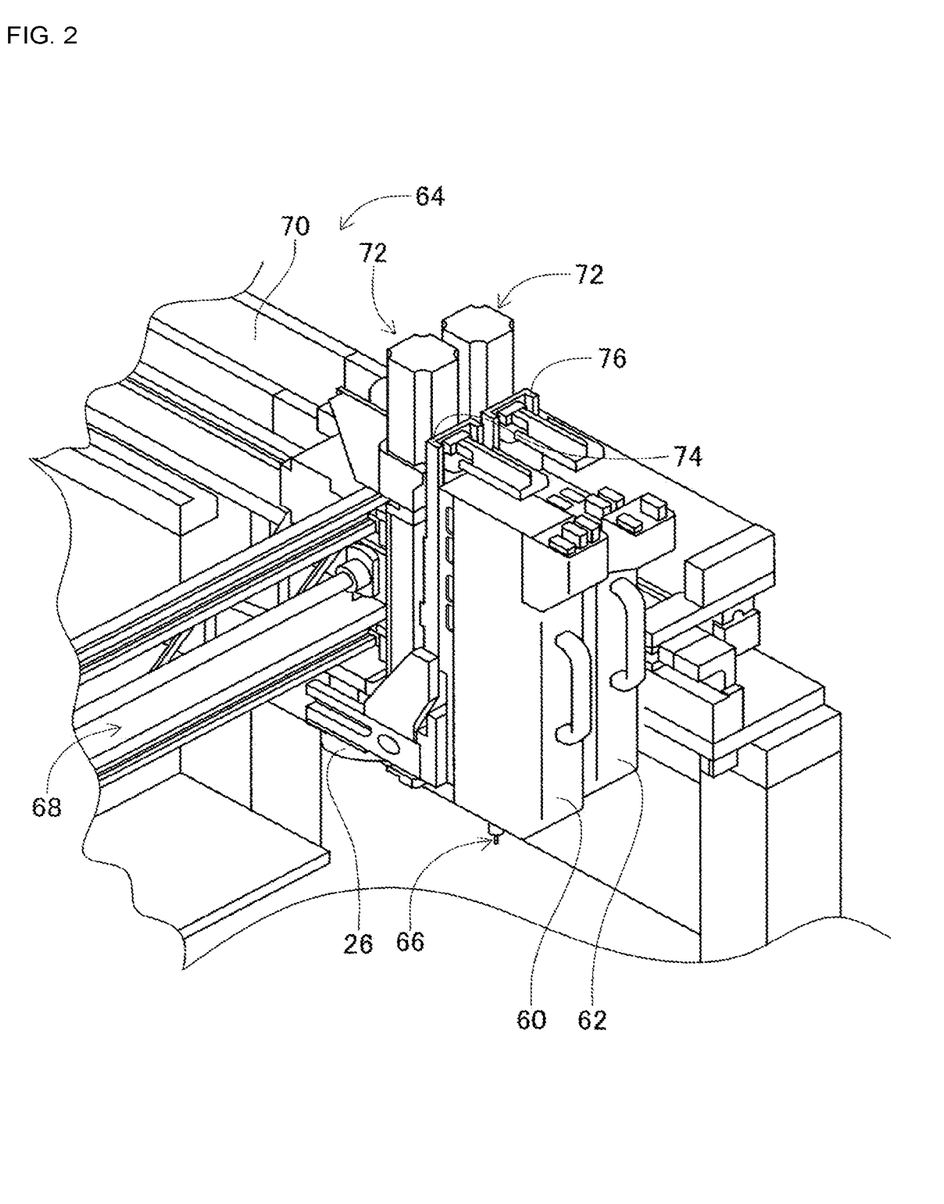
FIG. 2 is a perspective view of a component mounting device of the component mounter.

Component mounting device 24 is provided on beam section 42, and includes work heads 60 and 62 and work head moving device 64. As shown in FIG. 2, suction nozzle 66 is provided on a lower surface of each work head 60 and 62, with a component being picked up and held by the suction nozzle 66. Further, work head moving device 64 includes X-direction moving device 68, Y-direction moving device 70, and Z-direction moving device 72. Work heads 60 and 62 are moved together to any position on frame 40 by X-direction moving device 68 and Y-direction moving device 70. Also, work head 60 and 62 are detachably attached to sliders 74 and 76 respectively, and Z-direction moving device 72 moves sliders 74 and 76 in a vertical direction individually. That is, work heads 60 and 62 are moved in a vertical direction individually by Z-direction moving device 72.

Mark camera 26 is attached to slide 74 in a state facing downwards, and is moved in the X direction, Y direction, and Z direction together with work head 60. Thus, mark camera 26 images any position on frame section 40. As shown in FIG. 1, component camera 28 is provided in a state facing upwards on frame section 40 between board conveying and holding device 22 and component supply device 30. Thus, component camera 28 images a component held by suction nozzle 66 of work heads 60 or 62.

Component supply device 30 is provided at an end of frame section 40 in the front-rear direction. Component supply device 30 includes tray-type component supply device 78 and feeder-type component supply device (refer to FIG. 3) 80. Tray-type component supply device 78 supplies components in a state arranged in a tray. Feeder-type component supply 80 device supplies components via a tape feeder or stick feeder (not shown).

Loose component supply device 32 is provided at the other end of frame section 40 in the front-rear direction. Loose component supply device 32 lines up multiple components that are in a scattered state, and supplies the components in a lined-up state. That is, this device arranges multiple components that have random orientations to have a specified orientation and supplies the components in the specified orientation. Note that, components supplied by component supply device 30 and loose component supply device 32 may include electronic circuit components, configuration components of solar panels, configuration components of power modules, and the like. Also, electronic circuit components include components with leads and components without leads.

Figure 3:
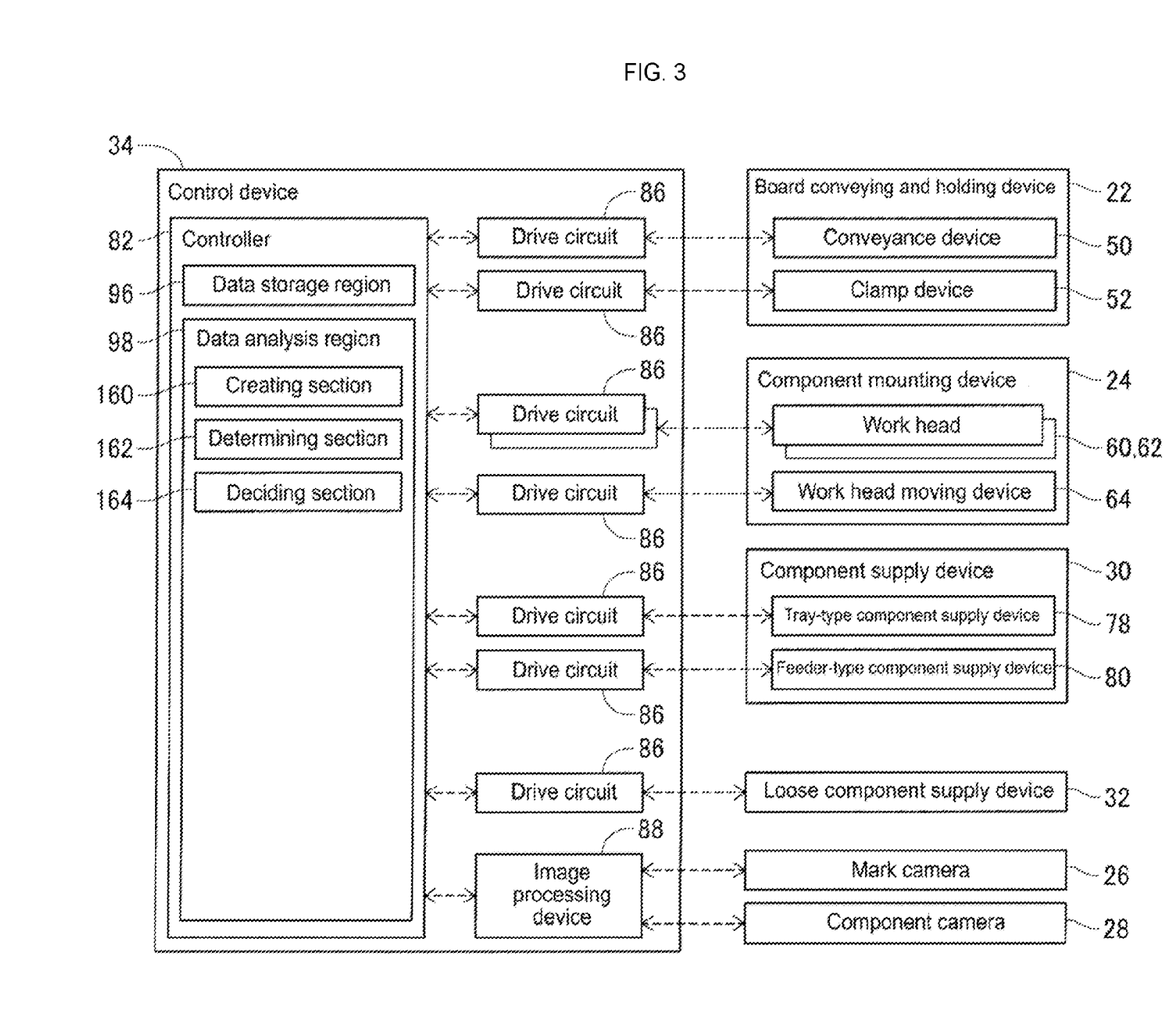
FIG. 3 is a block diagram showing a control device of the component mounter.

Control device 34 is provided with controller 82, multiple drive circuits 86, and image processing device 88. The multiple drive circuits 86 are connected to conveyance device 50, clamp device 52, work heads 60 and 62, work head moving device 64, tray type component supply device 78, feeder type component supply device 80, and loose component supply device 32. Controller 82 is provided with a CPU, ROM, RAM, and so on, is formed mainly from a computer, and includes data storage region 96 and data analysis region 98. Data storage region 96 is a region that memorizes various data; data analysis region 98 is a region that analyzes various data. Also, controller 82 is connected to the multiple drive circuits 86. By this, operation of board conveying and holding device 22, component mounting device 24, and so on is controlled by controller 82. Further, controller 82 is also connected to image processing device 88. Image processing device 88 is for processing image data acquired by mark camera 26 and component camera 28, and controller 82 acquires various information from the image data.

Component mounter operation Component mounter 10, according to the above configuration, mounts components on circuit board 12 held by board conveying and holding device 22. Specifically, circuit board 12 is conveyed to a work position, and is fixedly held at that position by clamp device 52. Next, mark camera 26 moves above circuit board 12 and images circuit board 12. By this, information related to a holding position of circuit board 12 is obtained. Also, component supply device 30 or loose component supply device 32 supplies components at a specified supply position. One of the work heads 60 or 62 moves above the component supply position and holds a component using suction nozzle 66. Continuing, work head 60 or 62 holding a component is moved above component camera 28, and the component held by suction nozzle 66 is imaged by component camera 28. Accordingly, information related to the holding position of the component is obtained. Continuing, work head 60 or 62 holding the component moves above circuit board 12, and corrects the error in the holding position of circuit board 12 and the error in the holding position of the component and so on. Then, the component is mounted on circuit board 12 by being released by suction nozzle 66.

Recognition of a position of an electrode of a component by the component camera As described above, with component mounter 10, to mount a component held by suction nozzle 66 on circuit board 12, information related to the holding position and the like of the component by suction nozzle 66 is acquired from component camera 28. In particular, if the component to be mounted on circuit board 12 is an electronic circuit component with a lead (also referred to as a "leaded component"), the leads should be inserted into through-holes formed in the circuit board 12, therefore information related to a position of a tip of the leads is acquired from component camera 28.

Figure 4:
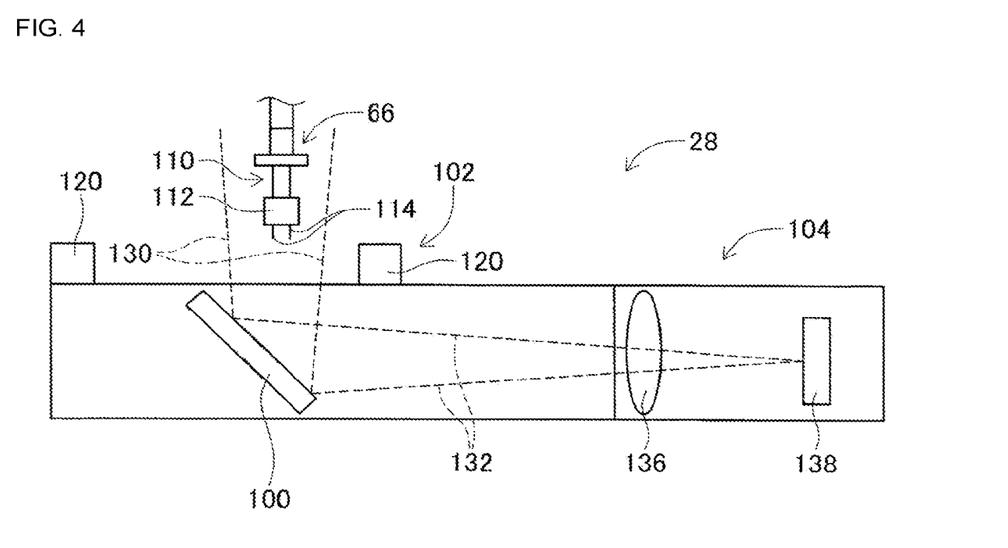
FIG. 4 is a schematic view of a component camera.

In detail, as shown in FIG. 4, component camera 28 is provided with mirror 100, laser illumination 102, and imaging device 104. Mirror 100 is arranged at a 45 degree angle below suction nozzle 66 holding leaded component 110 that is to be imaged. Note that, leaded component 110 includes component main body section 112, and multiple leads 114 extending from the bottom surface of component main body section 112, and is held by suction nozzle 66 by component main body section 112 with leads 114 pointing downwards.

Also, laser illumination 102 is configured from four laser emitting devices 120 (only two of the laser emitting devices are shown in the figure). The four laser emitting devices 120 are arranged at four evenly spaced positions to surround leaded component 110 held by suction nozzle 66. Then, the four laser emitting devices 120 shine laser light towards leaded component 100 held by suction nozzle 66 from four side locations. Note that, because laser light does not diffuse, each laser emitting device 120 illuminates the tips of leads 114 of leaded component 110 held by suction nozzle 66 in a pinpoint manner with laser light.

Light emitted from laser illumination 102 is reflected by leads 114 of leaded component 110 held by suction nozzle 66, and hits mirror 100 via a light path (the path between the two dotted lines 130). Then, light that hits mirror 100 is reflected by mirror 100 and hits imaging device 104 along a light path (the path between the two dotted lines 132).

Imaging device 104 has lens 136 and imaging element 138, and light that hits imaging device 104 is detected by imaging element 138 via lens 136. By this, image data of the tips of leads 114 of leaded component 110 held by suction nozzle 66 is obtained. And, by analyzing the image data in data analysis region 98 of controller 82, the positions of the tips of leads 114 are recognized. In this manner, it is possible to appropriately perform recognition processing of the positions of the tips of leads 114 by imaging leaded component 110 held by suction nozzle 66 (also referred to as "tip recognition processing") using component camera 28.

Figure 5:
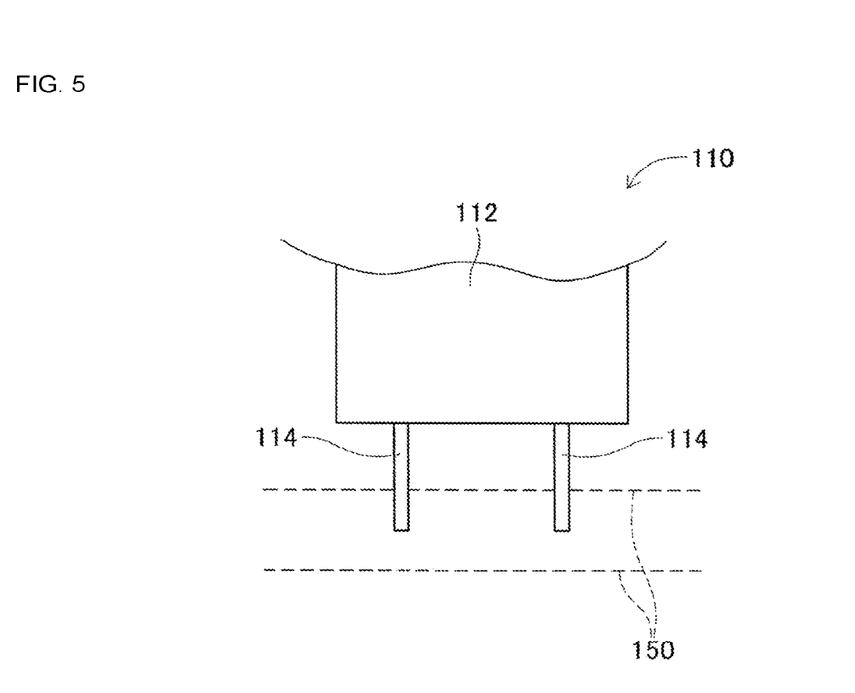
FIG. 5 shows a state of laser light being emitted towards leads of a leaded component.

However, with component camera 28, because laser light is emitted towards leads 114 and imaging is performed using the reflected light, there is a problem that tip recognition processing of leads 114 cannot always be performed appropriately. In detail, because laser light does not diffuse, as shown in FIG. 5, laser light is emitted towards leaded component 110 along a light path (the path between the two dotted lines 150) with a specified width. Here, as shown in FIG. 5, in a case in which the tips of leads 114 are positioned inside the light path, because light is reflected by the tips of leads 114, the tips of leads 114 are imaged. In such a case, it is possible to perform tip recognition processing of leads 114 appropriately.

Figure 6:
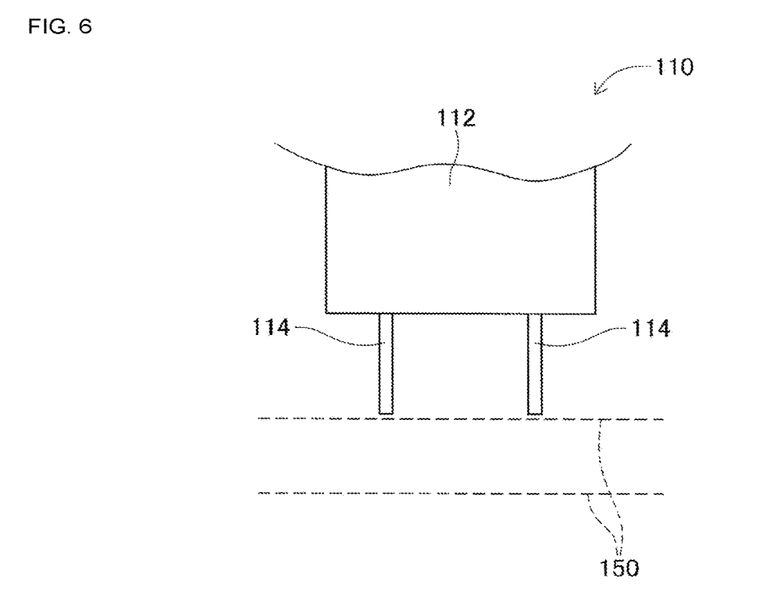
FIG. 6 shows a state of laser light being emitted towards leads of a leaded component.
Figure 7:
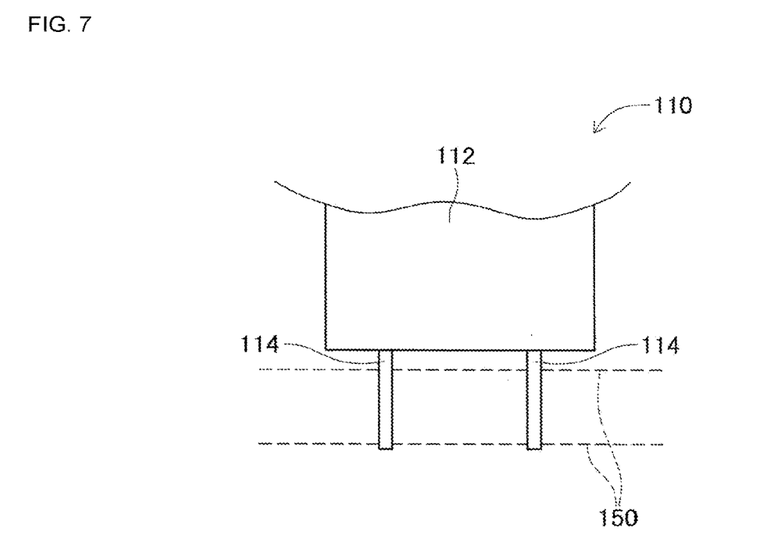
FIG. 7 shows a state of laser light being emitted towards leads of a leaded component.

On the other hand, as shown in FIG. 6, in a case in which the tips of leads 114 are positioned above the light path, because light does not shine on the tips of leads 114, the tips of leads 114 cannot be imaged. In such a case, it is not possible to perform tip recognition processing of leads 114 appropriately. On the other hand, as shown in FIG. 7, in a case in which the tips of leads 114 are positioned below the light path, although light is shone on a base section of leads 114 on the component main body section side, light does not shine on the tips of leads 114, and the tips of leads 114 cannot be imaged. In such a case, too, tip recognition processing of leads 114 cannot be performed.

Therefore, when imaging leaded component 110, it is necessary to set the imaging position of leaded component 110 such that the tips of leads 114 are positioned inside the emitting range of the laser light. However, even if the imaging position is set such that the tips of leads 114 are positioned inside the emitting range of the laser light, due to variance in the length of leads 114, there are cases in which tip recognition processing of leads 114 cannot be performed.

In detail, even for leaded components of the same type, there is slight variance in the length of leads. In particular, for leaded components supplied by an axial feeder, there are cases in which the variance in the length of leads is large. An axial feeder supplies leaded components in a bent state after cutting the leads of axial-type leaded components to a specified length. For leaded components supplied by such an axial feeder, there are cases in which the variance in the length of leads is large due to factors such as lead diameter and material.

Figure 8:
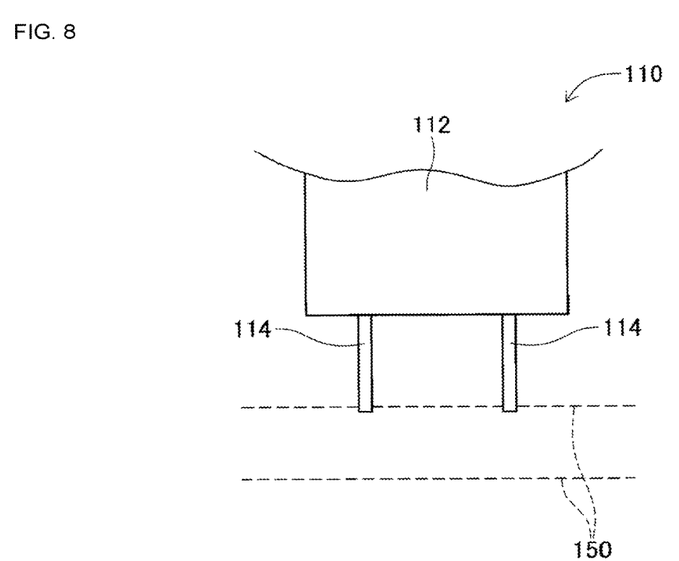
FIG. 8 shows a state of laser light being emitted towards leads of a leaded component.

In cases such as this where there is variance in the length of leads, even if the imaging position of leaded component 110 is set such that the tips of leads 114 are positioned inside the emitting range of the laser light, there are cases in which tip recognition processing cannot be performed depending on the length of a lead. Specifically, for example, in a case in which the imaging position of leaded component 110 is set as shown in FIG. 8, that is, in a case in which the imaging position of leaded component 110 is set such that the tips of leads 114 are positioned close to the upper limit of the emitting range of the laser light, if the length of leads 114 is normal, light shines on the tips of leads 114. However, if, due to variance, the length of leads 114 is short, even if the imaging position of leaded component 110 is the same as the position shown in FIG. 8, as shown in FIG. 6, the tips of leads 114 will be positioned above the emitting range of the laser light, and light will not shine on the tips of leads 114. In such a case, tip recognition processing cannot be performed.

Figure 9:
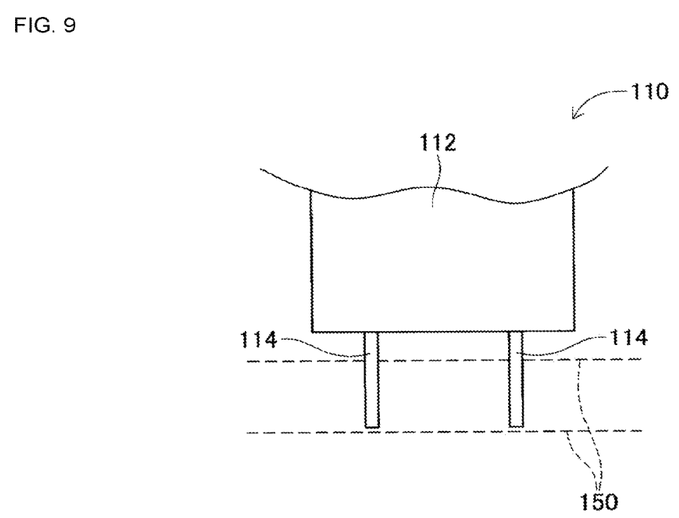
FIG. 9 shows a state of laser light being emitted towards leads of a leaded component.

Also, for example, in a case in which the imaging position of leaded component 110 is set as shown in FIG. 9, that is, in a case in which the imaging position of leaded component 110 is set such that the tips of leads 114 are positioned close to the lower limit of the emitting range of the laser light, if the length of leads 114 is normal, light shines on the tips of leads 114. However, if, due to variance, the length of leads 114 is long, even if the imaging position of leaded component 110 is the same as the position shown in FIG. 9, as shown in FIG. 7, the tips of leads 114 will be positioned below the emitting range of the laser light, and light will not shine on the tips of leads 114. In such a case, too, tip recognition processing cannot be performed.

In consideration of the above, with component mounter 10, the imaging position of leaded component 110 is set such that the tips of leads 114 are positioned at a central point inside the emitting range of the laser light. Specifically, a recommended imaging position for leaded component 110 (also referred to as "recommended imaging position") is memorized in data memory region 96 of controller 82. And, a position above the recommended imaging position by a set distance (in the present embodiment, 0.5 mm) is set as an upper limit imaging position (also referred to as "imaging upper limit position"), and a position below the recommended imaging position by a set distance (in the present embodiment, 0.5 mm) is set as a lower limit imaging position (also referred to as "imaging lower limit position"). Then, when leaded component 110 held by suction nozzle 66 is moved downwards from the imaging upper limit position towards the imaging lower limit position, imaging is performed by component camera 28 at each predetermined pitch (in the present embodiment, 0.1 mm).

Figure 10:
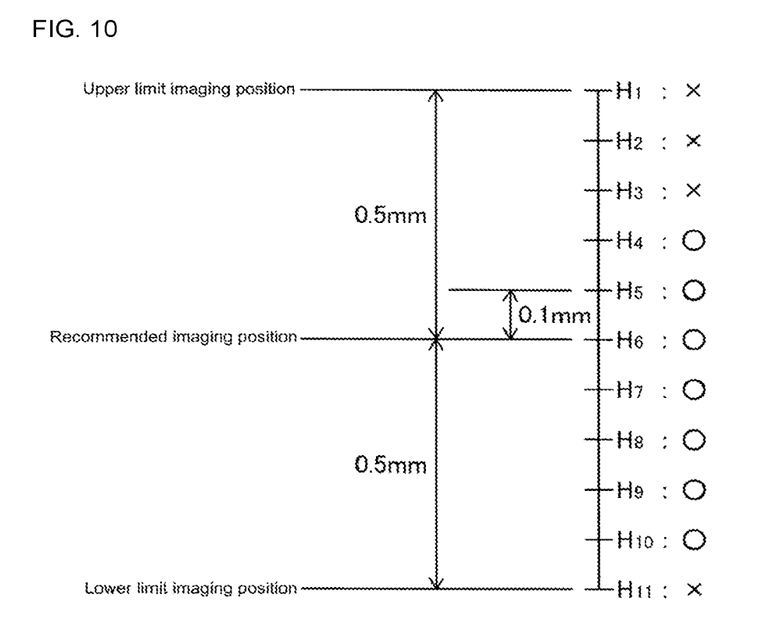
FIG. 10 shows a conceptual view of an imaging position of a first embodiment.

That is, for example, as shown in FIG. 10, 0.5 mm above the recommended imaging position is set as the imaging upper limit position, and 0.5 mm below the recommended imaging position is set as the imaging lower limit position. And, every 0.1 mm from the imaging lower limit position to the imaging upper limit position is set as an imaging position. By this, in order from the top down, eleven imaging positions, H1 to H11, are set. When imaging positions are set in such a manner, as leaded component 110 held by suction nozzle 66 is moved from the imaging upper limit position (H1) to the imaging lower limit position (H11), imaging is performed at each imaging position by component camera 28.

When leaded component 110 is imaged according to the above procedure, image data according to each imaging is created in data analysis region 98 of controller 82. That is, image data is created for each imaging position (H1 to H11). Then, for each image data of the multiple imaging positions (H1 to H11), it is determined in data analysis region 98 whether recognition of the tips of leads 114 is possible. Here, for example, assuming a case in which it is determined that with image data for the imaging positions H1 to H3 and H11, recognition of the tips of leads 114 is not possible, and with image data for the imaging positions H4 to H10, recognition of the tips of leads 114 is possible. To illustrate this, in FIG. 10, "X" is written by imaging positions for which it has been determined that recognition of the tips of leads 114 is not possible (H1 to H3, and H11), while "O" is written next to imaging positions for which it has been determined that recognition of the tips of leads 114 is possible (H4 to H10).

In such a manner, when it is determined whether recognition of the tips of leads 114 is possible for each imaging position, a position at a central point of the imaging positions for which it has been determined that recognition of the tips of leads 114 is possible (H4 to H10) is re-set as the recommended imaging position. That is, the imaging position (H7) at a central point of the highest imaging position (H4) of the imaging positions for which it has been determined that recognition of the tips of leads 114 is possible (also referred to as "recognition upper limit position") and the lowest imaging position (H10) for which it has been determined that recognition of the tips of leads 114 is possible (also referred to as "recognition lower limit position") is re-set as the recommended imaging position.

That is, when leaded component 110 held by suction nozzle 66 is moved from the imaging upper limit position (H1) to the imaging lower limit position (H11), when leaded component 110 is positioned at the recognition upper limit position (H4), as shown in FIG. 8, the tips of leads 114 are positioned near the upper limit inside the emitting range of the laser light. Also, when leaded component 110 is positioned at the recognition lower limit position (H10), as shown in FIG. 9, the tips of leads 114 are positioned near the lower limit inside the emitting range of the laser light. Therefore, when leaded component 110 is positioned at a central point of the recognition upper limit position (H4) and the recognition lower limit position (H10), as shown in FIG. 5, the tips of leads 114 are positioned approximately at a central point inside the emitting range of the laser light. By this, it is possible to set imaging position H7 at which the tips of leads 114 are at a central point inside the emitting range of the laser light as the recommended imaging position.

When the recommended imaging position is re-set in this manner, when imaging the next leaded component, imaging of leaded component 110 is performed at the re-set recommended imaging position. By this, from the next leaded component it is possible to image the tips of leads 114, even if the variance in the length of the leads is relatively large, meaning it is possible to appropriately perform tip recognition processing of leads 114 without adjusting the imaging position. Also, from imaging of the next leaded component, in a case in which tip recognition processing of leads 114 is not performed appropriately based on the image data at the recommended imaging position, re-setting of the recommended imaging position is performed as described above. By this, the recommended imaging position is updated, and it is possible to appropriately perform tip recognition processing of leads 114 at the newly set recommended imaging position.

Note that, the set distances for setting the imaging upper limit position and the imaging lower limit position for when performing re-setting of the recommended imaging position may be set at any value depending on the emitting range of the laser light. Also, the imaging pitch when performing re-setting of the recommended imaging position may be set at any value, but considering factors such as the imaging quantity and the accuracy, setting the value around 0.1 to 0.5 mm is desirable.

Also, in the above descriptions, tip recognition processing of leads 114 is performed appropriately at all the imaging positions between the recognition upper limit position and the recognition lower limit position, but there are cases in which tip recognition processing of leads 114 cannot be performed appropriately at at least one of the imaging positions between the recognition upper limit position and the recognition lower limit position. This may occur due to reflecting and so on of the laser light by foreign matter or the like attached to lead 114 and so on.

Figure 11:
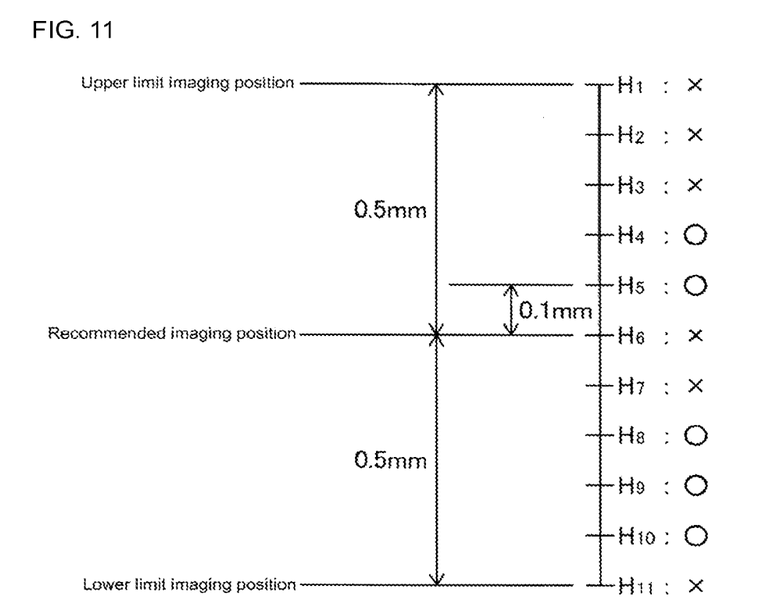
FIG. 11 shows a conceptual view of an imaging position of a first embodiment.

Specifically, for example, as shown in FIG. 11, there are cases in which it is determined that with image data for the imaging positions H1 to H3, H6, H7, and H11, recognition of the tips of leads 114 is not possible, and with image data for the imaging positions H4, H5, and H8 to H10, recognition of the tips of leads 114 is possible. That is, there are cases in which tip recognition processing of leads 114 cannot be performed appropriately at imaging positions (H6 and H7) that are between the recognition upper limit position (H4) and the recognition lower limit position (H10).

In such a case, the imaging position in a central position (H9) between the recognition lower limit position (H10) and the imaging position (H8) below the imaging positions (H6 and H7) for which tip recognition processing could not be performed between the recognition upper limit position (H4) and the recognition lower limit position (H10) is re-set as the recommended imaging position. By this, it is possible to perform tip recognition processing based on image data for which the tips of leads 114 are positioned inside the emitting range of the laser light towards the lower end, that is, image data imaged in a state in which laser light is shone on a portion largely including the tips of leads 114, meaning it is possible to appropriately recognize the positions of the tips of leads 114.

Note that, as shown in FIG. 3, data analysis region 98 of controller 82 includes creating section 160, determining section 162, and deciding section 164. Creating section 160 is a functional section for creating image data for each imaging position. Determining section 162 is a functional section for determining whether the positions of the tips of leads 114 can be recognized based on image data of each imaging position. Deciding section 164 is a functional section for deciding the recommended imaging position based on the determination result of determining section 162.

Second Embodiment With component mounter 10 of the first embodiment, multiple imaging positions are set in order from top to bottom between the imaging upper limit position and the imaging lower limit position, but with component mounter 10 of a second embodiment, multiple imaging positions are set at positions in order separated from the recommended imaging position with the recommended imaging position at the center.

Figure 12:
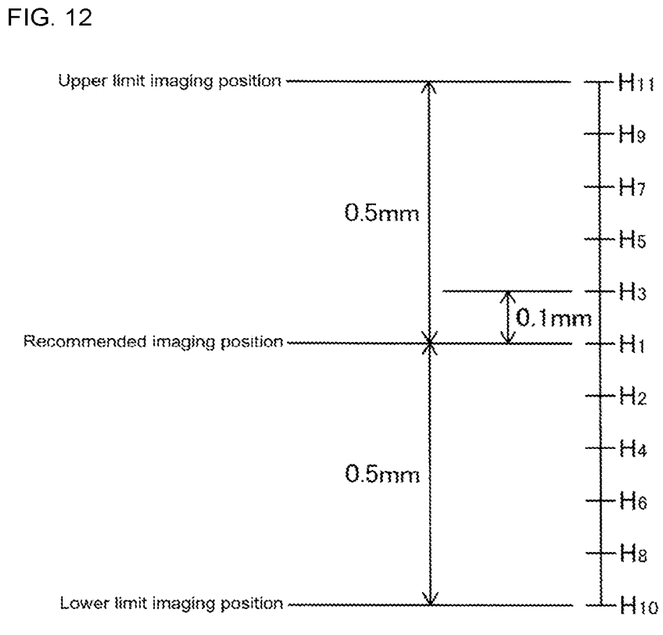
FIG. 12 shows a conceptual view of an imaging position of a second embodiment.

Specifically, as shown in FIG. 12, a recommended imaging position memorized in data storage region 96 is set as the first imaging position (H1). Then, an imaging position separated from the recommended imaging position downwards by a distance corresponding to a set pitch (in the present embodiment, 0.1 mm) is set as the second imaging position (H2). Next, an imaging position separated from the recommended imaging position upwards by a distance corresponding to a set pitch (in the present embodiment, 0.1 mm) is set as the third imaging position (H3). Further, an imaging position separated from the recommended imaging position downwards by a distance corresponding to twice the set pitch is set as the fourth imaging position (H4), and an imaging position separated from the recommended imaging position upwards by a distance corresponding to twice the set pitch is set as the second imaging position (H5). That is, an imaging position separated from the recommended imaging position downwards by a distance corresponding to (set pitch×N) is set as the 2N imaging position (where N is a positive integer), and an imaging position separated from the recommended imaging position upwards by a distance corresponding to (set pitch×N) is set as the (H2N+1) imaging position (where N is a positive integer). Note that, the imaging position of the upper limit separated from the recommended imaging position upwards, that is, the upper limit imaging position, in a similar manner to the first embodiment, is a position separated by a set distance (in the present embodiment, 0.5 mm) upwards from the recommended imaging position. Also, the imaging position of the lower limit separated from the recommended imaging position downwards, that is, the lower limit imaging position, in a similar manner to the first embodiment, is a position separated by a set distance (in the present embodiment, 0.5 mm) downwards from the recommended imaging position. By this, in the example shown in FIG. 12, eleven imaging positions (H1 to H11) are set.

When imaging positions are set as above, leaded component 110 is moved to an imaging position (H1) and imaged by component camera 28. Then, based on image data created from the imaging, tip recognition processing of leads 114 is performed. Here, in a case in which the position of the tips of leads 114 are recognized based on the image data, the imaging position (H1) of the image data used for that recognition processing is re-set as the recommended imaging position. On the other hand, in a case in which the position of the tips of leads 114 are not recognized based on the image data, the leaded component 110 is moved to the next imaging position (H2), and tip recognition processing is performed based on the image data at that position. Here, in a case in which the position of the tips of leads 114 are recognized based on the image data, the imaging position (H2) of the image data used for that recognition processing is re-set as the recommended imaging position. On the other hand, in a case in which the position of the tips of leads 114 are not recognized based on the image data, the leaded component 110 is moved to the next imaging position (H3), and tip recognition processing is performed based on the image data at that position. That is, leaded component 110 is moved to the next imaging position and tip recognition processing is performed based on the image data at that position until the positions of the tips of leads 114 are recognized based on the image data.

Specifically, for example, in a case in which leaded component 110 is moved in order to each of five imaging positions (H1 to H5), but the positions of the tips of leads 114 are not recognized based on the image data of each imaging position, leaded component 110 is moved to imaging position H6, and tip recognition processing is performed based on the image data at that position. Here, in a case in which the position of the tips of leads 114 are recognized based on the image data at imaging position H6, that imaging position (H6) is re-set as the recommended imaging position. Then, imaging at imaging positions H7 to H11 is not performed, and tip recognition processing based on image data of imaging positions H7 to H11 is not performed.

In this manner, by setting the recommended imaging position, an imaging position at which the tips of leads 114 are positioned close to a central point inside the emitting range of the laser light can be set as the recommended imaging position. By this, similar effects to the first embodiment are realized.

Further, the present invention is not limited to the above example embodiments, and various changed or improved methods of embodiment are possible based on the knowledge of someone skilled in the art. Specifically, for example, in component mounter 10 of an embodiment above, work heads 60 and 62 configured such that suction nozzle 66 does not pivot are used, but a work head configured such that a suction nozzle does pivot may be used.

Figure 13:
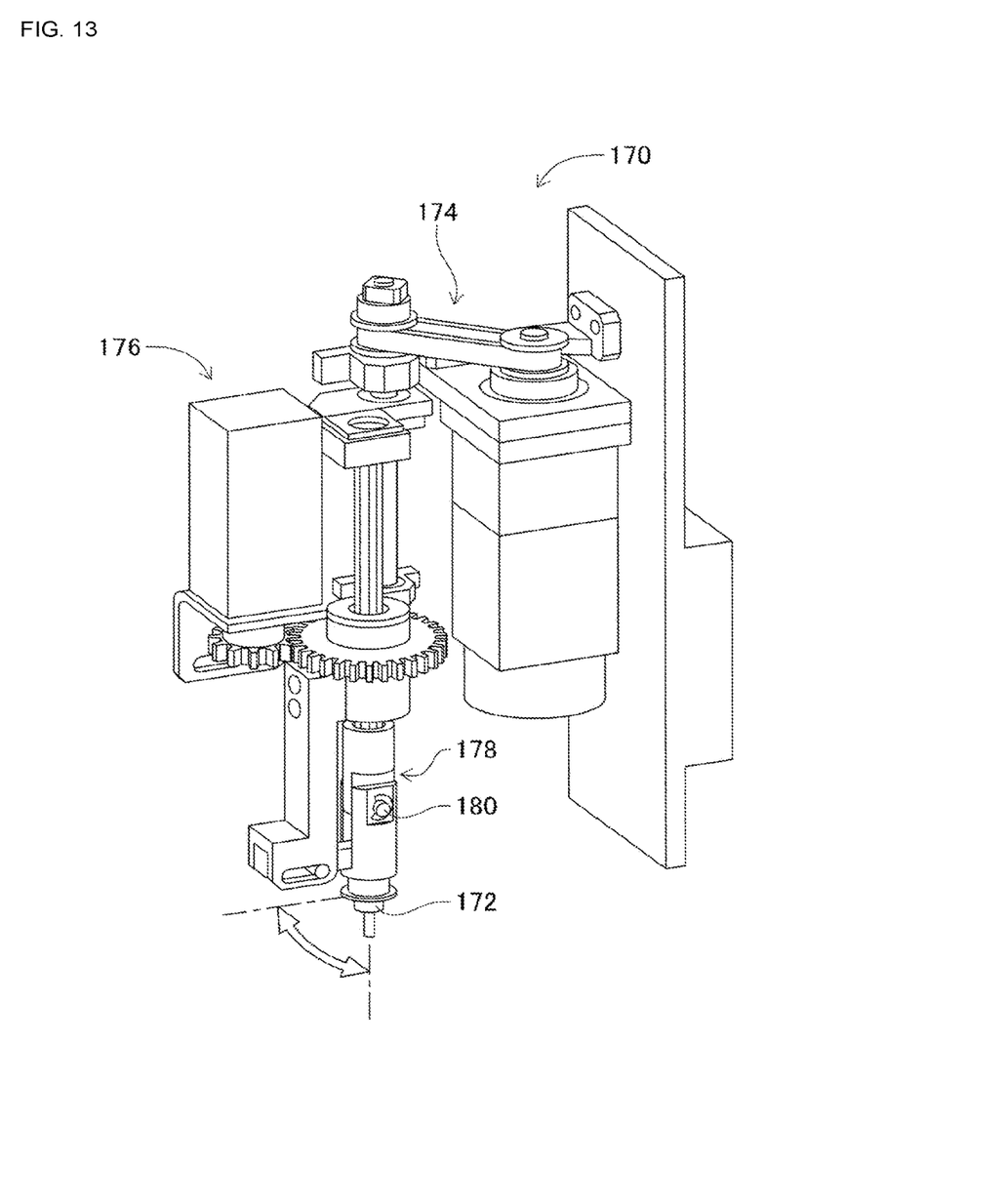
FIG. 13 shows an alternative example of a work head.

Specifically, work head 170 shown in FIG. 13 includes suction nozzle 172, nozzle pivoting device 174, and nozzle rotating device 176. Suction nozzle 172 is removably attached to a lower section of holder 178, and holder 178 is bendable around support shaft 180. Holder 178 is bent 90 degrees upwards by operation of nozzle pivoting device 174. By this, suction nozzle 172 attached to holder 178 is pivoted 90 degrees. Note that, suction nozzle 172 picks up and holds a component such as leaded component 110 with holder 178 in a non-pivoted state. Then, by pivoting holder 178 by 90 degrees, leads 114 of the held leaded component 110 are made to face downwards. However, before holder 178 is pivoted, suction nozzle 172 is rotated by the rotation of nozzle rotating device 176 such that the leads 114 of leaded component 110 held by suction nozzle 172 that is in the pivoted position face downwards in a vertical direction. With such a work head 170, the positions of the tips of leads 114 change depending on the holding position of leaded component 110 on suction nozzle 172. Therefore, when using a head such as work head 170, it is particularly effective to set the recommended imaging position using the procedure described above.

Also, in the above embodiments, the present invention is applied to recognition processing of the positions of the tips of leads 114 of leaded component 110, but the present invention may be applied to an electrode of an electronic circuit component without leads, such as for recognition processing for the positions of bumps of a component. Further, the present invention is not limited to the electrodes of electronic circuit components, and may be applied to recognition processing of the positions of the tips of protruding sections of components.

Also, in the first embodiment, when moving leaded component 110 from the imaging upper limit position to the imaging lower limit position, imaging was performed at a set pitch each time, but imaging may be performed at a set pitch each time when moving leaded component 110 from the imaging lower limit position to the imaging upper limit position.

Also, in the first embodiment, a position at a central point between the imaging upper limit position and the imaging lower limit position is set as the recommended imaging position, but any position between the imaging upper limit position and the imaging lower limit position may be set as the recommended imaging position.

Also, in the first embodiment, in a case in which tip recognition processing of leads 114 cannot be performed appropriately at at least one of the imaging positions between the imaging upper limit position and the imaging lower limit position, a position between an imaging position below the imaging position for which tip recognition processing could not be performed between the recognition upper limit position and the recognition lower limit position, and the recognition lower limit position, is set as the recommended imaging position; however, a position between an imaging position above the imaging position for which tip recognition processing could not be performed between the recognition upper limit position and the recognition lower limit position, and the recognition upper limit position, may be set as the recommended imaging position.

REFERENCE SIGNS LIST

28: component camera (recognition device); 98: data analysis region (data analysis device); 102: laser illumination (light source); 104: imaging device; 160: creating section; 162: determining section; 164: deciding section

The invention claimed is:

1. A recognition device for recognizing a position of a protruding section of a component to be mounted on a board, the recognition device comprising:
   a light source configured to emit light to a protruding section of a component;
   an imaging device configured to image the protruding section of the component based on light reflected by the protruding section when light is emitted from the light source to the protruding section of the component; and
   a data analysis device configured to recognize the position of the protruding section of the component imaged by the imaging device based on image data imaged by the imaging device, the data analysis device including
   a creating section configured to, when a target component that is an imaging target of the imaging device is moved from one to another of a predetermined first set position and a second set position that is lower than the first set position, use the imaging device to image the protruding section of the component for each of a predetermined pitch and create image data for each pitch,
   a determining section configured to determine whether the position of the protruding section of the component can be recognized based on each piece of image data for each pitch created by the creating section, and
   a deciding section configured to decide, from among imaging positions that are positions of the target component during imaging according to image data for which it was determined by the determining section to be possible to recognize the position of the protruding section of the component, a position that is between a recognition upper limit position that is a position closest to the first set position and a recognition lower limit position that is a position closest to the second set position as a recommended imaging position.

2. The recognition device according to claim 1, wherein the deciding section decides a middle position between the recognition upper limit position and the recognition lower limit position as the recommended imaging position.

3. The recognition device according to claim 1, wherein the deciding section, when there is image data for which it has been decided by the deciding section that the position of the protruding section of the component cannot be recognized among image data of imaging positions between the recognition upper limit position and the recognition lower limit position, decides a position between an imaging position below the imaging position according to the image data for which it has been decided by the deciding section that the position of the protruding section of the component cannot be recognized and the recognition lower limit position as the recommended imaging position.

4. A recognition device for recognizing a position of a protruding section of a component to be mounted on a board, the recognition device comprising:
   a light source configured to emit light to a protruding section of a component;
   an imaging device configured to image the protruding section of the component based on light reflected by the protruding section when light is emitted from the light source to the protruding section of the component; and
   a data analysis device configured to recognize the position of the protruding section of the component imaged by the imaging device based on image data imaged by the imaging device, the data analysis device including
   a creating section configured to use the imaging device to, in a state with a target component that is an imaging target of the imaging device positioned at a specified position, image the protruding section of the component,
   a determining section configured to determine whether the position of the protruding section of the component can be recognized based on image data created by the creating section, and
   a deciding section configured to, in a case in which it is determined by the determining section that the position of the protruding section of the component can be recognized, decide an imaging position that is the position of the target component during imaging according to the decided image data as a recommended imaging position,
   wherein the creating section performs imaging multiple times until it is determined by the determining section that the position of the protruding section of the component can be recognized based on the image data created by the creating section, such that, during a first imaging, the protruding section of the target component positioned at a reference position is imaged, during a 2N (where N is a positive integer) imaging, the protruding section of the target component positioned at a position separated by a distance corresponding to set distance×N in a direction from the reference position to one of a first set position and a second set position is imaged, and during a 2N+1 (where N is a positive integer) imaging, the protruding section of the target component positioned at a position separated by a distance corresponding to set distance×N in a direction from the reference position to another of the first set position and the second set position is imaged, and image data is created by the creating section, and
   wherein the determining section determines whether the position of the protruding section of the target component can be recognized based on the image data created by the creating section for each creation of image data by the creating section.

* * * * *